United States Patent [19]

Roselle et al.

[11] Patent Number: 5,032,221
[45] Date of Patent: Jul. 16, 1991

[54] ETCHING INDIUM TIN OXIDE

[75] Inventors: Paul L. Roselle, Webster; Gustavo R. Paz-Pujalt; Ronald M. Wexler, both of Rochester, all of N.Y.

[73] Assignee: Eastman Kodak Company, Rochester, N.Y.

[21] Appl. No.: 520,486

[22] Filed: May 7, 1990

[51] Int. Cl.$^5$ ............................................. B44C 1/22
[52] U.S. Cl. .................................... 156/643; 156/646; 156/656
[58] Field of Search ............... 156/643, 646, 652, 655, 156/656, 659.1, 667; 204/192.35, 192.32

[56] References Cited

U.S. PATENT DOCUMENTS 4,818,326  4/1989  Liu et al. ..................... 156/643 X
4,878,993  11/1989  Rossi et al. .................. 156/667 X

OTHER PUBLICATIONS

"A Novel Process for Reactive Ion Etching on InP, using CH$_4$/H$_2$", by V. Niggebrügge, M. Klug and G. Garns, Inst. Phys. Conf. Ser. No. 79: Chapter 6, 1985.

Primary Examiner—David A. Simmons
Assistant Examiner—Thi Dang
Attorney, Agent, or Firm—Raymond L. Owens

[57] ABSTRACT

ITO is etched by a plasma containing CH$_3$. gas.

4 Claims, 2 Drawing Sheets

ETCHING INDIUM TIN OXIDE

FIELD OF THE INVENTION

The present invention relates to the etching of indium tin oxide.

BACKGROUND OF THE INVENTION

Solid state CCD image sensors often employ a double polysilicon gate structure to form the sensor electrodes. Such a structure has the first polysilicon electrode (poly-1) separated from the second polysilicon electrode (poly-2) by a thin insulating layer of silicon dioxide. Poly-1 is slightly overlapped by poly-2. The systematic variation of the potential applied to these electrodes, referred to as clocking, permits the device to function. In the case of frame transfer CCD image sensors, light passes through the polysilicon electrodes and creates electron hole pairs in the underlying silicon. These electrons are accummulated prior to clocking the polysilicon electrodes to remove the accummulated charge. The polysilicon electrodes, through which light must pass, are not entirely transparent. This lack of transparency results in the reduction of sensitivity and spectral response of the image sensor.

Due to its transparency, it has been recognized that indium tin oxide would be an effective electrode for such a device. The use of an indium tin oxide electrode enhances the blue response and overall sensitivity of a frame transfer image sensor. In fact, it has been recognized that if indium tin oxide were to be used in such a device the effective ASA of the device could be increased by as much as a factor of two. One reason that ITO has not been used on such devices is because it is difficult to pattern such material. Heretofore, the only practical method for etching indium tin oxide has been by immersion in a hot hydroiodic acid solution. Such an acid etches the material isotropically and is not selective to photoresist. These two reasons alone show the difficulties involved in using ITO for microelectronic aPPlications where small features are defined by photoresist lithography.

It has also been recognized that ITO can be used as an antistatic coating on materials such as webs used in the manufacture of photosensitive materials. Thereagain, it is difficult to use such a material because it is not practical to pattern it.

SUMMARY OF THE INVENTION

It is the object of this invention to provide a new method for the etching of indium tin oxide.

In accordance with this invention, it has been discovered that a plasma containing methyl radicals ($CH_3 \bullet$) can effectively etch indium tin oxide anisotropically and with high selectivity to photoresist and silicon dioxide.

The above object is achieved in a method of etching indium tin oxide, comprising the steps of:
  forming a plasma containing $CH_3 \bullet$; and
  etching the ITO by volatilizing the ITO by a reaction with the plasma of $CH_3 \bullet$.

BRIEF DESCRIPTION OF THE INVENTION

DESCRIPTION OF THE PREFERRED EMBODIMENTS

With reference to FIGS. 1, 2 and 3a-3c, a process for the plasma etching of indium tin oxide is described.

A plasma is a state of matter in which the gases in a vessel with a total pressure less than atmospheric pressure are partially ionized by an electric field. As is well understood, such an electric field can be from a radio frequency generator, microwave frequency generator or DC voltage field.

A plasma, ignited by the action of such an electric field on a mixture of $CH_4$ gas and $H_2$ gas, will contain methyl radicals ($CH_3 \bullet$) as well as other species generated from the cracking of the molecules of $CH_4$ and $H_2$. As in any plasma, the concentrations of the various species in the plasma depend upon the power and frequency of the electric field applied, the pressure of the plasma, and the concentrations of the gases used. It should be understood that $CH_4$ and $H_2$ mixtures are not the only means of producing methyl radicals ($CH_3 \bullet$) and that mixtures of ethane and hydrogen, propane and hydrogen, or other organic compounds will result in methyl radical creation in plasma and will, in so doing, etch ITO.

Figure 1:
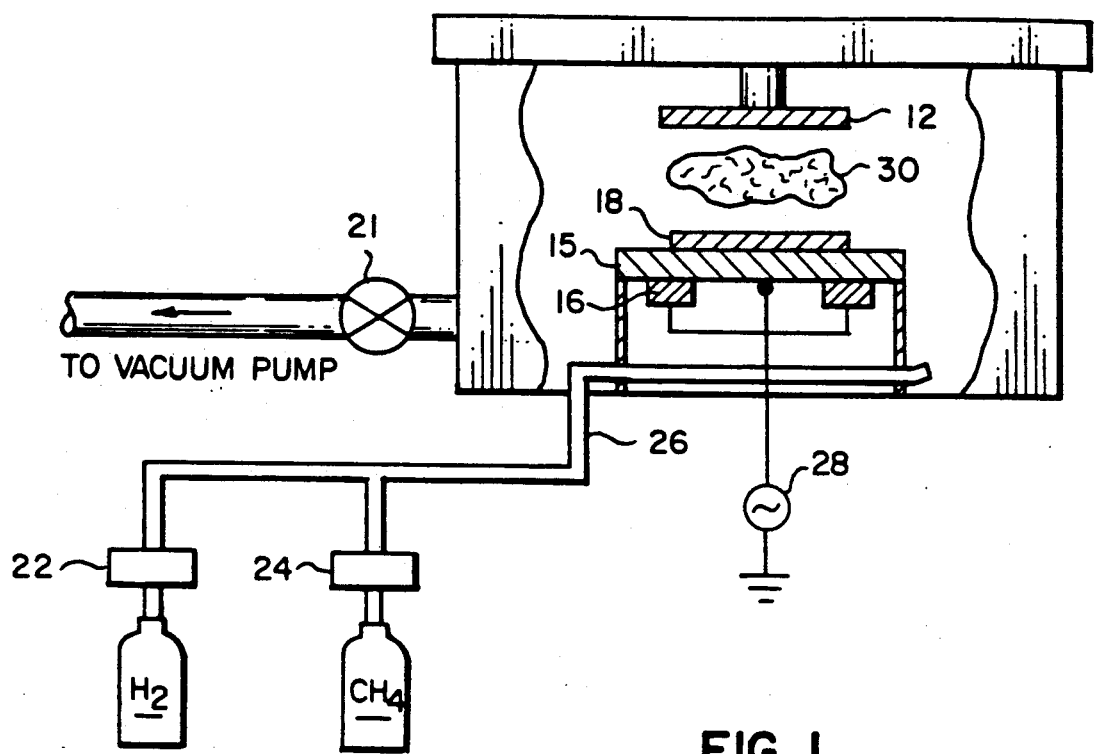
FIG. 1a is a schematic, in partial cross-section, of a conventional plasma etcher which uses radio frequency energy to ignite and sustain the plasma.

For an etcher as represented in FIG. 1, a wafer 18 is placed on a lower electrode 15 which is connected to an RF radiation source 28. Vacuum is achieved in the chamber by the use of an oil diffusion pump and rotary vacuum pump, not shown. The lower electrode 15 is heated by resistive heaters 16 located on the back of the electrode. The $H_2$ and $CH_4$ gases are admitted into the chamber through a diffuser 26. The flows of the gases are regulated by mass flow controllers 22 and 24. Process pressure in the vessel is controlled by a vacuum throttle valve 21. When the desired flow rates, pressure and temperature are achieved, a plasma of $CH_4$ and $H_2$ is ignited in a space 30 between the lower electrode 15, on which the wafer 18 sits, and an upper electrode 12. The resultant $CH_3 \bullet$ generated in region 30 will react with the ITO on the wafer 18 volatilizing the ITO off the wafer to be pumped away by the vacuum pump The pressure of the plasma of $CH_4$ and $H_2$ must be maintained below the polymerization point of the plasma. Likewise, the ratio of $CH_4$ to $H_2$ should be less than 20% to prevent excessive polymerization of the species in the plasma. Such excessive polymerization produced by too high of a pressure and/or too high of a concentration of $CH_4$ in $H_2$ will prevent ITO from etching.

Figure 2:
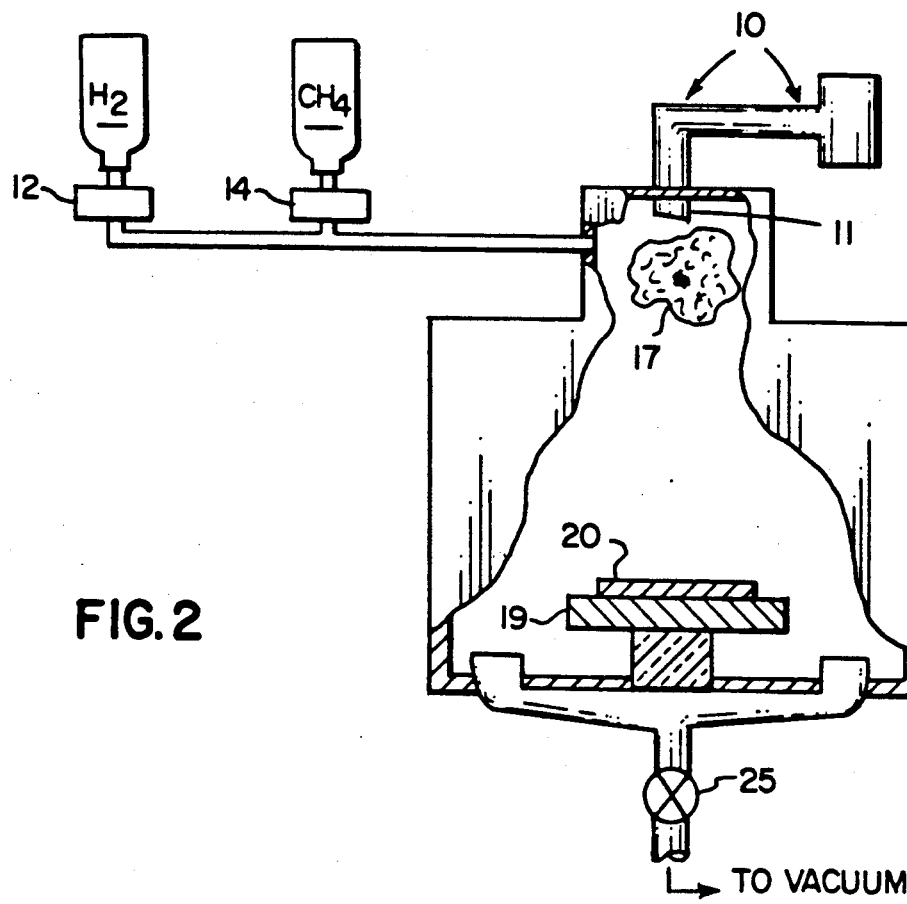
FIG. 2 is a schematic, in partial cross-section, of another plasma etcher which uses microwave energy to ignite and sustain the plasma.

For an etcher system as represented in FIG. 2, the source of the plasma excitation is a microwave generator 10 located on top of the vacuum chamber. A wafer 20 is placed on a lower electrode 19 which can be biased by an additional power source if needed. Vacuum is achieved with a vacuum pump (not shown). $H_2$ and $CH_4$ gases are admitted into the plasma generation region 17. The flows of the gases are controlled by mass flow controllers 12 and 14 and the pressure in the chamber is maintained by a throttle valve 25. When the plasma is to be ignited the microwave energy is sent into the plasma generating region 17 through a wave guide 11 where it partially ionizes the gases into a plasma state. The $CH_3 \bullet$ species generated in this plasma travel to the wafer 20 and etch the exposed ITO off of the wafer.

Figure 3A:
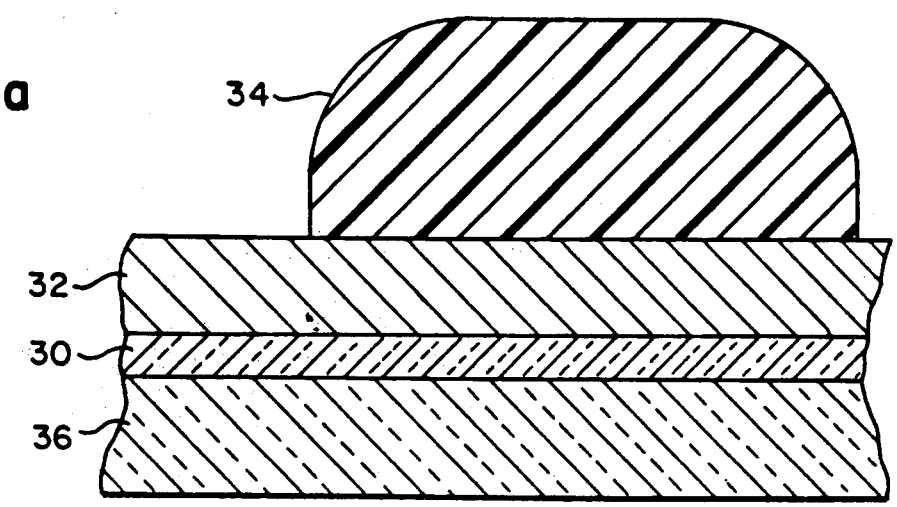
FIG. 3 shows various steps in patterning an ITO layer formed on an $SiO_2$ insulating layer provided on a silicon substrate.
Figure 3B:
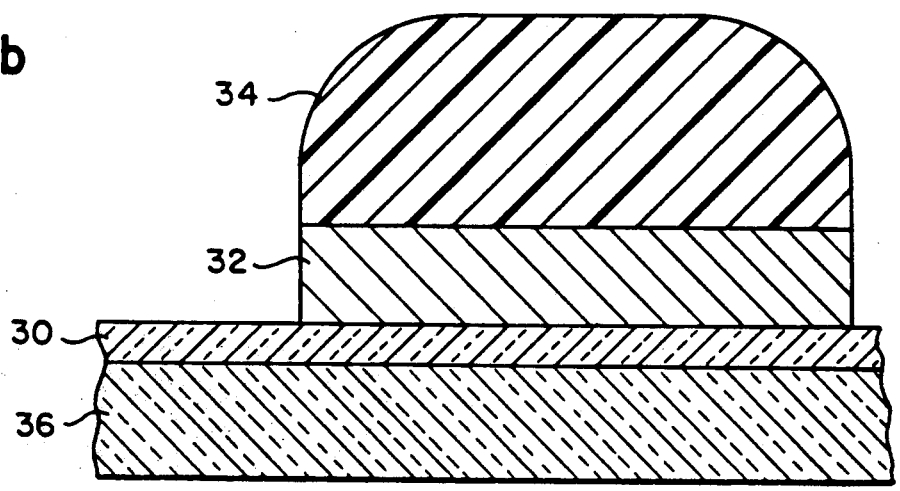
Figure 3C:
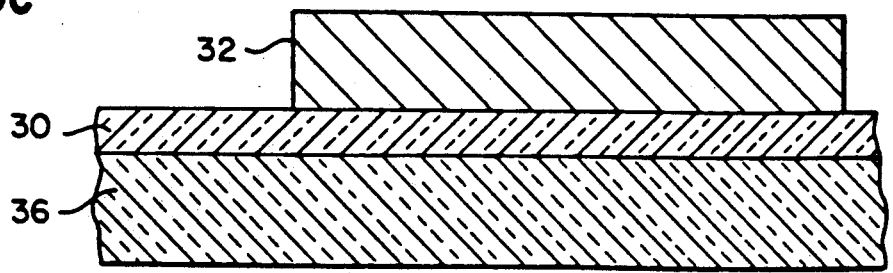

FIGS. 3a-c show the process of pattern transfer for the definition of ITO where the etched ITO is to be used as a poly-1 electrode. In FIG. 3a it is seen that microlithographic photoresist mask 34 has been deposited and patterned in a conventional manner on the surface of an ITO layer 32 which has been deposited on an $SiO_2$ layer 30 on a silicon substrate 36. ITO is most usually deposited by RF sputter deposition.

In FIG. 3b the ITO layer 32 has been etched anisotropically by the plasma of $CH_3 \bullet$ thereby transferring the photoresist pattern into the ITO and stopping on the $SiO_2$ layer 30. Measurements have shown that the plasma of $CH_3 \bullet$ that etches the ITO has a high selectivity to both the photoresist and the underlying $SiO_2$ layer.

In FIG. 3c the photoresist 34 has been stripped off of the ITO 32 and the device may proceed to further processing. The photoresist is most usually removed by $O_2$ plasma stripping.

EXAMPLE

Without limiting the generality of this invention, the mechanism of etching of ITO is believed to be caused by methyl radicals reacting with indium and tin to create volatile organometallic compounds as shown by the following reaction:

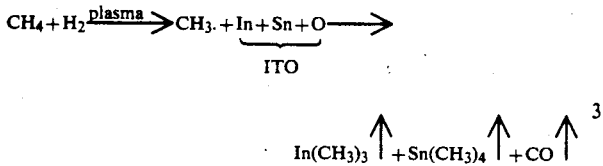

Other starting gases can be used provided they form a plasma having $CH_3 \bullet$.

An etcher similar to the one represented by FIG. 1 was used to etch ITO. The radio frequency used to ignite and sustain the plasma was 13.56 megahertz at 85 watts forward power. The wafer was heated to a temperature of 70° C. The chamber was evacuated to a base pressure of $1 \times 10^{-6}$ prior to the admission of the $CH_4$ and $H_2$ gases. The flow rate for the $CH_4$ was 25 sccm and the flow rate the the $H_2$ was 150 sccm. A process pressure of 150 Mtorr was maintained during the etch. The sputter deposited ITO etched at a rate of 275 angstroms per minute and showed very high selectivity to the photoresist and the underlying silicon dioxide. Cross-sectional scanning electron micrographs of the etched ITO showed the etch to be highly anisotropic with no evidence of undercutting the photoresist.

The invention has been described in detail with particular reference to certain preferred embodiments thereof, but it will be understood that variations and modifications can be effected within the spirit and scope of the invention.

We claim:

1. A method of etching ITO comprising the steps of:
   forming a plasma from a gas mixture of $CH_4$ and $H_2$; and
   etching the ITO with the plasma.

2. The method of claim 1 wherein the plasma is formed by mixing $CH_4$ gas and $H_2$ gas in a chamber at a pressure selected to prevent polymerization; and igniting a plasma of the $CH_4$ and $H_2$ by subjecting the mixture to RF or microwave radiation or other suitable electric field.

3. A method of etching ITO deposited on an $SiO_2$ layer on a silicon substrate, comprising the steps of:
   (a) depositing and patterning a microlithographic mask on the ITO surface to expose portions of the ITO; and
   (b) igniting a plasma from a mixture of $CH_4$ and $H_2$ gases which etch the exposed ITO portions thereby transferring the pattern into the ITO, anisotropically.

4. The method of claim 3 wherein the ratio $CH_4$ to $H_2$ is less than 20%

* * * * *